(12) United States Patent
Araki et al.

(10) Patent No.: US 10,009,003 B2
(45) Date of Patent: Jun. 26, 2018

(54) ELASTIC WAVE DEVICE

(71) Applicant: Murata Manufacturing Co., Ltd., Nagaokakyo-shi, Kyoto-fu (JP)

(72) Inventors: Masato Araki, Nagaokakyo (JP); Katsuya Daimon, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 10 days.

(21) Appl. No.: 15/334,465

(22) Filed: Oct. 26, 2016

(65) Prior Publication Data

US 2017/0047905 A1 Feb. 16, 2017

Related U.S. Application Data

(63) Continuation of application No. PCT/JP2015/064773, filed on May 22, 2015.

(30) Foreign Application Priority Data

May 26, 2014 (JP) ................. 2014-108114

(51) Int. Cl.
*H03H 9/145* (2006.01)
*H03H 9/25* (2006.01)
*H03H 9/64* (2006.01)
*H03H 9/02* (2006.01)

(52) U.S. Cl.
CPC .... *H03H 9/02535* (2013.01); *H03H 9/02992* (2013.01); *H03H 9/1457* (2013.01);
(Continued)

(58) Field of Classification Search
CPC ........... H03H 9/02535; H03H 9/02881; H03H 9/02992; H03H 9/14532; H03H 9/14541;
(Continued)

(56) References Cited

U.S. PATENT DOCUMENTS 7,576,471 B1 * 8/2009 Solal .................. H03H 9/02858
310/313 B
2009/0121810 A1 5/2009 Fujii et al.
(Continued)

FOREIGN PATENT DOCUMENTS

JP 2000-183681 A * 6/2000
JP 2011-101350 A 5/2011
(Continued)

OTHER PUBLICATIONS

Official Communication issued in International Patent Application No. PCT/JP2015/064773, dated Jul. 7, 2015.
(Continued)

*Primary Examiner* — Barbara Summons
(74) *Attorney, Agent, or Firm* — Keating & Bennett, LLP

(57) ABSTRACT

An elastic wave device includes an IDT provided on a piezoelectric substrate. The IDT includes edge areas in which an elastic wave propagation velocity is slower than an elastic wave propagation velocity in a center area of an electrode finger intersecting region. The edge areas are provided on both sides of the center area in an intersecting width direction. The IDT includes a first section where the propagation velocity in the center area is relatively fast and a second section where the propagation velocity in the center area is relatively slow in the elastic wave propagation direction. In accordance with the propagation velocities in the center areas of the first and second sections, the widths and propagation velocities in the edge areas of the first and second sections excite a piston mode.

20 Claims, 5 Drawing Sheets

(52) U.S. Cl.
CPC .... *H03H 9/14532* (2013.01); *H03H 9/14541* (2013.01); *H03H 9/25* (2013.01); *H03H 9/64* (2013.01); *H03H 9/6433* (2013.01)

(58) Field of Classification Search
CPC .... H03H 9/1457; H03H 9/14582; H03H 9/25; H03H 9/64; H03H 9/6433
USPC .................. 333/193–196; 310/313 B, 313 D
See application file for complete search history.

(56) References Cited

U.S. PATENT DOCUMENTS

| | | |
|---|---|---|
| 2011/0068655 A1 | 3/2011 | Solal et al. |
| 2013/0051588 A1* | 2/2013 | Ruile ...................... H03H 3/08 381/190 |
| 2013/0249647 A1 | 9/2013 | Nakanishi et al. |

FOREIGN PATENT DOCUMENTS

| | | |
|---|---|---|
| JP | 2012-186808 A | 9/2012 |
| JP | 2013-544041 A | 12/2013 |
| WO | 2008/038481 A1 | 4/2008 |

OTHER PUBLICATIONS

English translation of Official Communication issued in corresponding Japanese Patent Application No. 2015-537473, dated Sep. 8, 2015.

* cited by examiner

ELASTIC WAVE DEVICE

CROSS REFERENCE TO RELATED APPLICATIONS

This application claims the benefit of priority to Japanese Patent Application 2014-108114 filed on May 26, 2014 and is a Continuation application of PCT/JP2015/064773 filed on May 22, 2015. The entire contents of each application are hereby incorporated herein by reference.

BACKGROUND OF THE INVENTION

1. Field of the Invention

The present invention relates to elastic wave devices that propagate surface acoustic waves, boundary acoustic waves, or the like, and particularly relates to elastic wave devices that include a piston mode.

2. Description of the Related Art

Elastic wave devices capable of suppressing high-order transverse modes by exciting piston modes are known. For example, Japanese Unexamined Patent Application Publication No. 2013-544041 discloses a device in which a dielectric film is laminated on leading end portions of electrode fingers of an interdigital transducer (IDT) electrode. A portion where the dielectric film is laminated is referred to as an edge area, and an acoustic velocity in the edge area is slower than an acoustic velocity in a center area of a portion where the electrode fingers intersect with each other.

Further, Japanese Unexamined Patent Application Publication No. 2011-101350 cited below discloses a relationship of acoustic velocities in the center area and the edge area for realizing piston modes.

In Japanese Unexamined Patent Application Publication No. 2013-544041 and Japanese Unexamined Patent Application Publication No. 2011-101350, a piston mode is excited by adjusting a length as a dimension of the edge area along an elastic wave propagation direction and the acoustic velocity in the edge area. Accordingly, the length, width, and the like of the edge area for the excitation of the piston mode are defined for a single elastic wave propagation velocity.

In a longitudinally coupled resonator-type elastic wave filter including a plurality of IDTs, an elastic wave device provided with IDTs including narrow-pitch electrode finger portions, and the like, electrode finger pitches, metallization ratios, or the like are changed along the elastic wave propagation direction. As such, a method in which a length, width, and the like of the edge area are maintained to be constant, like in Japanese Unexamined Patent Application Publication No. 2013-544041 and Japanese Unexamined Patent Application Publication No. 2011-101350, is effective for a single elastic wave propagation acoustic velocity, but not effective in other portions where elastic waves propagate at a different velocity. Therefore, the above method cannot sufficiently suppress high-order transverse modes.

SUMMARY OF THE INVENTION

Preferred embodiments of the present invention provide an elastic wave device that includes piston modes and that significantly reduces or prevents high-order transverse modes.

An elastic wave device according to a preferred embodiment of the present invention includes a piezoelectric substrate and at least one IDT provided on the piezoelectric substrate. The IDT includes a plurality of first electrode fingers and a plurality of second electrode fingers interleaved with the plurality of first electrode fingers, and in a portion where the plurality of first electrode fingers and the plurality of second electrode fingers intersect with each other in an elastic wave propagation direction, edge areas in each of which an elastic wave propagation velocity is slower than that in a center area are provided on both sides of the center area in an intersecting width direction in which the first and second electrode fingers extend. The elastic wave device further includes a first section where the propagation velocity in the center area is relatively fast and a second section where the propagation velocity in the center area is relatively slow in the elastic wave propagation direction. In accordance with the elastic wave propagation velocity in the center area of the first section as well as the elastic wave propagation velocity in the center area of the second section, the elastic wave propagation velocity and a width as a dimension along the intersecting width direction in the edge area of the first section and the elastic wave propagation velocity and a width as a dimension along the intersecting width direction in the edge area of the second section are selected to excite a piston mode in each of the first section and the second section.

According to a preferred embodiment of the present invention, the piston mode is excited so that a minimal or a significantly reduced portion of a fundamental transverse mode phase rotation amount is included in each center of the first section and the second section in the intersecting width direction.

According to a preferred embodiment of the present invention, a portion of elastic wave device in which the fundamental transverse mode phase rotation amount is approximately 0 is included in the center of the elastic wave device in the intersecting width direction.

According to a preferred embodiment of the present invention, the elastic wave propagation velocity and the width as a dimension along the intersecting width direction in the edge area of the first section and the elastic wave propagation velocity and the width as a dimension along the intersecting width direction in the edge area of the second section, respectively correspond to the width as a dimension of the edge area of the first section along the intersecting width direction and the width as a dimension of the edge area of the second section along the intersecting width direction.

According to a preferred embodiment of the present invention, the width as a dimension of the edge area of the first section in the intersecting width direction is larger than the width as a dimension of the edge area of the second section in the intersecting width direction.

According to a preferred embodiment of the present invention, a dimension of the center area of the first section in the intersecting width direction differs from a dimension of the center area of the second section in the intersecting width direction.

According to a preferred embodiment of the present invention, an electrode finger pitch in the first section is larger than an electrode finger pitch in the second section.

According to a preferred embodiment of the present invention, a metallization ratio of the first section is larger than a metallization ratio of the second section.

According to a preferred embodiment of the present invention, mass addition films are provided on the first and second electrode fingers in the edge areas, and a thickness of the mass addition film in the first section is thinner than a thickness of the mass addition film in the second section.

According to a preferred embodiment of the present invention, in the edge areas, a propagation velocity in the first section is V'a, a propagation velocity in the second section is V'b, a width as a length of one edge area in a direction in which the electrode finger extends in the first section is Ea, a width of the edge area in the second section is Eb, and Ea/V'a is equal or substantially equal to Eb/V'b.

According to a preferred embodiment of the present invention, the widths of the edge areas in the first section and the second section are selected so that Ea/V'a is equal or substantially equal to Eb/V'b.

According to a preferred embodiment of the present invention, the metallization ratios of the edge areas in the first section and the second section are selected so that Ea/V'a is equal or substantially equal to Eb/V'b.

According to a preferred embodiment of the present invention, the mass addition films are laminated to cover the edge areas in the first section and the second section, and film thicknesses of the respective mass addition films positioned in the first section and the second section are selected so that Ea/V'a is equal or substantially equal to Eb/V'b.

According to a preferred embodiment of the present invention, the mass addition films are laminated to cover the edge areas in the first section and the second section, and at least one type is selected among the edge widths positioned in the first section and the second section, the metallization ratios of the edge areas, and the film thicknesses of the mass addition films laminated on the edge areas so that Ea/V'a is equal or substantially equal to Eb/V'b.

According to a preferred embodiment of the present invention, wide width portions are provided at the respective leading end sides of the first electrode fingers and the second electrode fingers. Each width of the wide width portions, as a dimension along the elastic wave propagation direction, is wider than a width in the center area, and the edge areas include the wide width portions.

According to a preferred embodiment of the present invention, a second wide width portion is provided on the first electrode finger at a position overlapping with the wide width portion provided on the second electrode finger in the elastic wave propagation direction, and another second wide width portion is provided on the second electrode finger at a position overlapping with the wide width portion provided on the first electrode finger in the elastic wave propagation direction.

According to a preferred embodiment of the present invention, the plurality of IDTs are arranged along the elastic wave propagation direction, and at least one of the plurality of IDTs corresponds to the first section while at least one of the remaining IDTs corresponds to the second section.

According to a preferred embodiment of the present invention, the elastic wave device is a longitudinally coupled resonator-type elastic wave filter.

According to a preferred embodiment of the present invention, the IDT includes an electrode finger main body portion and a narrow-pitch electrode finger portion including a narrower electrode finger pitch than the electrode finger main body portion and being provided at an end portion of the IDT in the elastic wave propagation direction; the electrode finger main body portion corresponds to the first section and the narrow-pitch electrode finger portion corresponds to the second section.

According to a preferred embodiment of the present invention, the elastic wave device includes one IDT as at least the one IDT and also includes reflectors disposed on both sides of the IDT in the elastic wave propagation direction to provide a one-port type elastic wave resonator.

An elastic wave device according to a preferred embodiment of the present invention includes piston modes, which significantly reduce or prevent high-order transverse modes.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified through descriptions of specific preferred embodiments of the present invention with reference to the drawings.

First Preferred Embodiment

Figure 1:
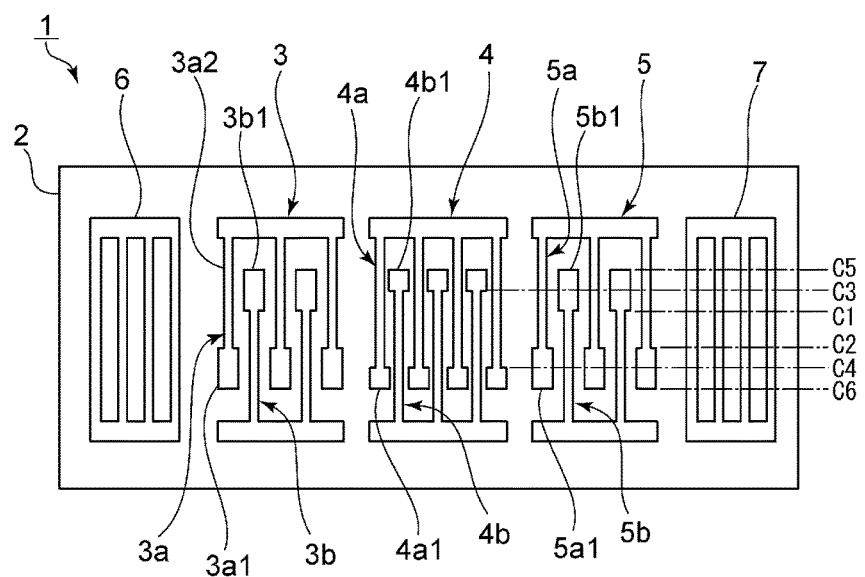
FIG. 1 is a schematic plan view of an elastic wave device according to a first preferred embodiment of the present invention.

FIG. 1 is a schematic plan view of an elastic wave device according to a first preferred embodiment of the present invention.

An elastic wave device 1 includes a piezoelectric substrate 2. The piezoelectric substrate 2 includes a piezoelectric single crystal such as $LiTaO_3$, $LiNbO_3$, or the like. However, the piezoelectric substrate 2 may include piezoelectric ceramics. Further, the piezoelectric substrate 2 may be formed by laminating a piezoelectric film on an insulative substrate, for example.

A first IDT 3, a second IDT 4, and a third IDT 5 are provided in that order on a principal surface of the piezoelectric substrate 2 along an elastic wave propagation direction. Reflectors 6 and 7 are provided on both sides of an area where the first, second, and third IDTs 3, 4, and 5 are provided in the elastic wave propagation direction as a longitudinal mode. The elastic wave device 1 is a longitudinally coupled resonator-type elastic wave filter including the first, second, and third IDTs 3, 4, and 5.

In the elastic wave device 1, the first and third IDTs 3 and 5 correspond to a first section of the elastic wave device 1, while the second IDT 4 corresponds to a second section the elastic wave device 1. In other words, an electrode finger pitch of the first and third IDTs 3 and 5 is larger than an electrode finger pitch of the second IDT 4. Accordingly, a wave length defined by the electrode finger pitch of the first and third IDTs 3 and 5 is larger than a wave length defined by the electrode finger pitch of the second IDT 4. Accordingly, an elastic wave propagation velocity in a center area, which is described below, of the first and third IDTs 3 and 5 is relatively high, while an elastic wave propagation velocity in a center area of the second IDT 4 as the second section is relatively slow.

The electrode finger pitch of the first IDT 3 and the third IDT 5 differs from the electrode finger pitch of the second IDT 4, because the pitches are adjusted in accordance with predetermined attenuation frequency characteristics. In general, in longitudinally coupled resonator-type elastic wave filters, electrode finger pitches of a plurality IDTs are generally not the same in dimension and include different dimensions in accordance with the target frequency characteristics.

The first IDT 3 includes a plurality of first electrode fingers 3*a* each one end of which is joined to a busbar, and a plurality of second electrode fingers 3*b* each one end of which is joined to another busbar and which are interleaved with the first electrode fingers 3*a*. Likewise, the second and third IDTs 4 and 5 respectively include a plurality of first electrode fingers 4*a* and 5*a* and a plurality of second electrode fingers 4*b* and 5*b* interleaved with the plurality of first electrode fingers 4*a* and 5*a*. Here, the plurality of electrode fingers each one end of which is joined to the busbar are referred to as a comb-shaped electrode.

The reflectors 6 and 7 each include a plurality of electrode fingers arranged in the elastic wave propagation direction. In a working example, both ends of the plurality of electrode fingers are short-circuited.

By exciting a piston mode of the elastic wave device 1, a high-order transverse mode is significantly reduced or prevented. More specifically, with respect to the first electrode finger 3*a*, a wide width portion 3*a*1 is provided at a leading end of the first electrode finger 3*a*, the leading end is positioned on the other end side opposite to the one end side joined to the busbar, and the wide width portion 3*a*1 is wider than a remaining portion 3*a*2 of the first electrode finger 3*a*. Likewise, a wide width portion 3*b*1 is provided at a leading end of the second electrode finger 3*b*.

Also in the second IDT 4, a wide width portion 4*a*1 is provided at a leading end of the first electrode finger 4*a*, and a wide width portion 4*b*1 is provided at a leading end of the second electrode finger 4*b*. Further, wide width portions 5*a*1 and 5*b*1 are provided at the respective leading ends of the first and second electrode fingers 5*a* and 5*b*.

The wide width portions 3*a*1 and 3*b*1 are provided in an area where the first and second electrode fingers 3*a* and 3*b* overlap with each other in the elastic wave propagation direction, in other words, in an intersecting area. In the elastic wave device 1, a direction in which the first and second electrode fingers 3*a* and 3*b* extend is referred to as an intersecting width direction. Further, a direction in which surface acoustic waves propagate along the principal surface of the piezoelectric substrate 2 is referred to as the elastic wave propagation direction. In the working example, the elastic wave propagation direction and a direction orthogonal to the intersecting width direction are the same or substantially the same direction.

With respect to the first IDT 3, the first electrode finger 3*a* and the second electrode finger 3*b* overlap with each other in the elastic wave propagation direction. The area where the first electrode finger 3*a* and the second electrode finger 3*b* overlap with each other in the elastic wave propagation direction is referred to as the intersecting area. The intersecting area includes a center area positioned in the center in the intersecting width direction and edge areas provided on both sides of the center area in the intersecting width direction. The edge areas are areas where a surface acoustic wave propagation velocity is relatively slow, in comparison with the center area. With respect to an area in which the first electrode 3*a* is provided, the areas that include the wide width portions 3*a*1 and 3*b*1 correspond to the edge areas. In the intersecting area, a covering percentage of metal with respect to the piezoelectric substrate in the area where the wide width portion 3*a*1 or 3*b*1 is provided differs from a covering percentage of metal with respect to the piezoelectric substrate in the center area. In other words, the covering percentage of the metal with respect to the piezoelectric substrate in the center area sandwiched between a one-dot chain line C1 and a one-dot chain line C2 in FIG. 1 is different from the covering percentage of the metal with respect to the piezoelectric substrate in the area enclosed by the one-dot chain line C1 and a one-dot chain line C5 as well as the covering percentage of the metal with respect to the piezoelectric substrate in the area enclosed by the one-dot chain line C2 and a one-dot chain line C6. A metallization ratio indicates a covering percentage of electrode fingers with respect to the piezoelectric substrate. The metallization ratio represents a value that is calculated by first obtaining the sum of the width of an electrode finger and a space between the electrode fingers adjacent to each other in a direction orthogonal or substantially orthogonal to the direction in which the electrode fingers extend and then dividing the width of the electrode finger by the sum to obtain the value.

The area enclosed by the one-dot chain line C1 and the one-dot chain line C2 is an inner side area of the portions where the wide width portions 3*a*1 and 3*b*1 are provided in the first IDT 3. This inner side area is referred to as the center area. The area sandwiched between the one-dot chain line C1 and the one-dot chain line C5 is the area where the wide width portion 3*b*1 is included in the first IDT 3. The area enclosed by the one-dot chain line C2 and the one-dot chain line C6 is the area where the wide width portion 3*a*1 is included in the first IDT 3. The area enclosed by the one-dot chain line C1 and the one-dot chain line C5 and the area enclosed by the one-dot chain line C2 and the one-dot chain line C6 are each referred to as the edge area. Accordingly, the edge areas are positioned on both sides of the center area in the intersecting width direction.

The covering percentage of the metal with respect to the piezoelectric substrate is larger in the edge area than that in the center area, which provides a higher metallization ratio in the edge area. Therefore, an acoustic velocity, which is a propagation velocity of elastic waves propagating in the piezoelectric substrate as a medium, is lower in the edge area than that in the center area.

Also in the third IDT 5, similar to the first IDT 3, edge areas are provided on both sides of a center area in the intersecting width direction.

On the other hand, in the second IDT 4, although the wide width portions 4*a*1 and 4*b*1 are provided, each dimension of the wide width portions 4*a*1 and 4*b*1 in the intersecting width direction is shorter than that of the wide width portions 3a1 and 3b1. Accordingly, in the second IDT4, the center area is an area between a one-dot chain line C3 and a one-dot chain line C4. The edge areas are an area between the one-dot chain line C3 and the one-dot chain line C5 and an area between the one-dot chain line C4 and the one-dot chain line C6.

According to the first preferred embodiment, in the second IDT 4, the dimension of the center area in the intersecting width direction and the dimension of the edge areas in the intersecting width direction are different from the dimension of the center area in the intersecting width direction and the dimension of the edge areas in the intersecting width direction in the first and third IDTs 3 and 5. Accordingly, ripples due to transverse modes are significantly reduced or prevented, as more specifically described below.

As discussed above, in the longitudinally coupled resonator-type elastic wave filters, the electrode finger pitches of a plurality of IDTs generally are not the same in dimension and different from each other in accordance with the target frequency characteristics.

The inventors of preferred embodiments of the present invention carried out research on the reduction or prevention of high-order transverse modes by exciting piston modes, and discovered that it is undesirable for the longitudinally coupled resonator-type elastic wave filter to include dimensions of the edge areas in the intersecting direction, acoustic velocities in the edge areas, and the like that are respectively set to be the same or substantially the same across the plurality of IDTs.

In the elastic wave device 1, the elastic wave propagation velocity in the center area of the first and third IDTs 3 and 5 is higher than that in the center area of the second IDT 4. Further, in the elastic wave device 1, the width as the dimension of the edge areas in the intersecting width direction of the first and third IDTs 3 and 5 is larger than the width dimension of the edge areas in the intersecting width direction of the second IDT 4. In other words, because the width of the edge areas in the first section and the width of the edge areas in the second IDT 4 are different from each other, it is possible to significantly reduce or prevent high-order transverse modes and excite piston modes. This point is described below with respect to experimental examples.

In the elastic wave device 1, in particular, an acoustic velocity in the center area of the first and third IDTs 3 and 5 is Va, and an acoustic velocity in the edge area is V'a. Further, an acoustic velocity in the center area of the second IDT 4 is Vb, and an acoustic velocity in the edge area of the second IDT 4 is V'b. As discussed above, since the electrode finger pitch of the second IDT 4 is relatively small, Va>Vb and V'a>V'b are satisfied.

The width of the edge area of the first IDT 3 is Ea, and the width of the edge area of the second IDT 4 is Eb. In the elastic wave device 1, the width Ea of the edge area is different from the width Eb of the edge area in accordance with the acoustic velocities V'a and V'b so that Ea/V'a is equal or substantially equal to Eb/V'b. Accordingly, high-order modes are significantly reduced or prevented. More specifically, because V'a>V'b and Ea/V'a is equal or substantially equal to Eb/V'b between the acoustic velocities in the edge areas and the widths of the edge areas, a fundamental transverse mode phase rotation amount is included in each center area of the first, second, and third IDTs 3, 4, and 5 without any change by satisfying the relationship between Ea/V'a and Eb/V'b described above. It is more preferable that a portion where the fundamental transverse mode phase rotation amount is approximately 0 be present in the center area, for example. In the intersecting width direction, the phase rotation amount is preferably set to be approximately 0 in the center area and the phase rotation amount in the edge area be approximately π/2, for example. More specifically, both the phase rotation amount with respect to the first IDT 3 and the phase rotation amount with respect to the second IDT 4 in the intersecting width direction are preferably approximately π/2, for example. When Ea/V'a is equal or substantially equal to Eb/V'b, the phase rotation amount with respect to the first IDT 3 and the phase rotation amount with respect to the second IDT 4 are 2π×(f/V'a)×Ea and 2π×(f/V'b)×Eb, respectively, and these are equal or substantially equal in quantity. Preferably, Ea/V'a and Eb/V'b are each equal or substantially equal to 1/(4×f), for example. As described above, by equalizing or substantially equalizing the phase rotation amounts in the edge areas arranged on both the sides of the center areas where the elastic wave velocities are different from each other and causing the fundamental transverse mode phase rotation amount in the center area to be small, piston modes are exited and high-order transverse modes are significantly reduced or prevented. The phase rotation amount is an absolute value of the product of a wave number and the length. Further, "f" is a frequency of the fundamental transverse mode elastic waves propagating in the intersecting width direction.

As discussed above, in order to significantly reduce or prevent high-order transverse modes and to excite an ideal or a substantially ideal piston mode, it is sufficient that the widths of the edge areas of the first section and the second section differ from each other in accordance with the elastic wave propagation velocities in the edge areas of the first section and the second section.

In the elastic wave device 1, the edge areas include the wide width portions 3a1, 3b1, and the like. However, according to a third preferred embodiment explained below, the edge areas may be defined without wide width portions. Accordingly, in order to significantly reduce or prevent high-order transverse modes, it may be sufficient to ensure that an elastic wave propagation velocity in the edge areas of the first section is different from an elastic wave propagation velocity in the edge areas of the second section. Alternatively, the elastic wave propagation velocity in the edge areas and the width of the edge areas in the first section may differ from the elastic wave propagation velocity in the edge areas and the width of the edge areas in the second section.

In the first section and the second section, the edge areas are provided on both the sides of each center area. Accordingly, only in one of the edge areas provided on both the sides, at least one of the elastic wave propagation velocity and the width of the edge area in the first section may differ from at least one of those in the second section.

Thus, in the first preferred embodiment, it is sufficient that the elastic wave propagation velocity in the edge area of the first section and the width as the dimension along the intersecting width direction as well as the elastic wave propagation velocity in the edge area of the second section and the width as the dimension along the intersecting width direction are selected to significantly reduce or prevent the high-order transverse modes and excite the piston mode. The width of the edge area on one side is selected to be the width as the dimension along the intersecting width direction, or alternatively, the widths of the edge areas on both the sides are selected.

In the first preferred embodiment, because the electrode finger pitch of each of the first and third IDT 3 and 5 is larger than the electrode finger pitch of the second IDT 4, the dimension of the edge areas of the first and third IDTs 3 and 5 in the intersecting width direction is larger than the dimension of the edge area of the second IDT 4 in the intersecting width direction and Ea/V'a is equal or substantially equal to Eb/V'b. Accordingly, the high-order transverse modes are significantly reduced or prevented.

Second Preferred Embodiment

Figure 2:
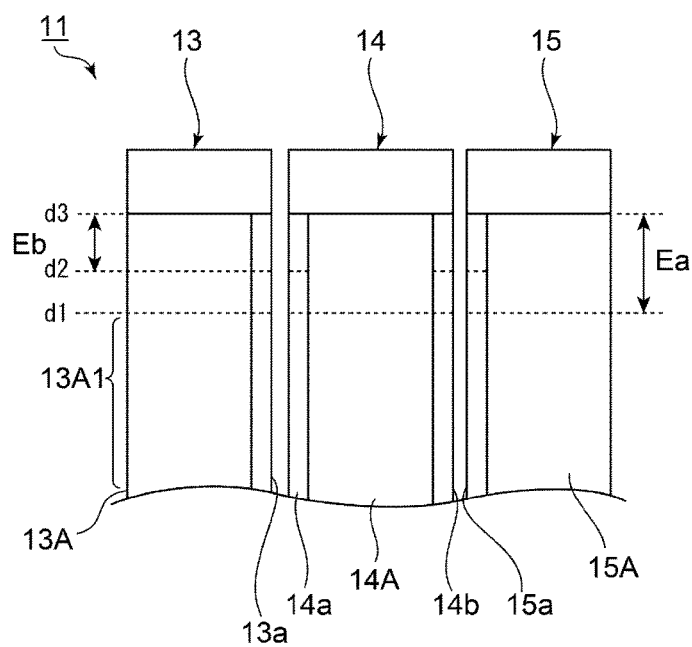
FIG. 2 is a schematic plan view of an elastic wave device according to a second preferred embodiment of the present invention.

FIG. 2 is a schematic plan view of an elastic wave device according to a second preferred embodiment of the present invention. An elastic wave device 11 shown in FIG. 2 is, similar the elastic wave device 1, a longitudinally coupled resonator-type elastic wave filter of a 3-IDT type. A first IDT 13, a second IDT 14, and a third IDT 15 are provided in the elastic wave propagation direction. A narrow-pitch electrode finger portion 13*a* is provided in the first IDT 13 and a narrow-pitch electrode finger portion 14*a* is provided in the second IDT 14 at a portion where the first IDT 13 and the second IDT 14 are arranged adjacent to each other. Likewise, at a portion where the second IDT 14 and the third IDT 15 are arranged adjacent to each other, the second IDT 14 includes a narrow-pitch electrode finger portion 14*b* and the third IDT 15 includes a narrow-pitch electrode finger portion 15*a*. Referring to the first IDT 13 as an example, the first IDT 13 includes an electrode finger main body portion 13A and the narrow-pitch electrode finger portion 13*a*. In the narrow-pitch electrode finger portion 13*a*, the electrode finger pitch is relatively narrow. Likewise, the second IDT 14 includes an electrode finger main body portion 14A and the narrow-pitch electrode finger portions 14*a* and 14*b*; and the third IDT 15 includes an electrode finger main body portion 15A and the narrow-pitch electrode finger portion 15*a*.

An acoustic velocity in the narrow-pitch electrode finger portion, whose electrode finger pitch is relatively narrow, is relatively slow. Accordingly, the electrode finger main body portions 13A, 14A, and 15A correspond to the first section of the elastic wave device 11, and the narrow-pitch electrode finger portions 13*a*, 14*a*, 14*b*, and 15*a* correspond to the second section of the elastic wave device 11. In other words, the first section and the second section may exist in a single IDT.

Detailed description of the electrode fingers of the first, second, and third IDTs 13, 14, and 15 in the elastic wave device 11 is omitted, and FIG. 2 schematically indicates the positions where the narrow-pitch electrode finger portions 13*a*, 14*a*, 14*b*, and 15*a* and the electrode finger main portions 13A, 14A, and 15A are provided. Further, the elastic wave device 11 is provided with, similar to the elastic wave device 1 of the first preferred embodiment, edge areas on both sides of the center area to excite a piston mode. This feature is more specifically described below.

Each electrode finger pitch of the electrode finger main body portions 13A, 14A, and 15A is a pitch A. Each electrode finger pitch of the narrow-pitch electrode finger portions 13*a*, 14*a*, 14*b*, and 15*a* is a pitch B.

Accordingly, in a portion where the first, second, and third IDTs 13, 14, and 15 are provided, segments of different electrode finger pitches exist on the same elastic wave propagation path.

A center area 13A1 of the electrode finger main body portion 13A is positioned in a lower portion relative to a broken line d1. In other words, the center area 13A1 is an area on the center side of the electrode finger main body portion 13A in the intersecting width direction. An area between the broken line d1 and a broken line d3 is an edge area of the electrode finger main body portion 13A. An outer side area of the broken line d3 is a high acoustic velocity area. In the narrow-pitch electrode finger portion 13*a*, an area on the center side relative to the broken line d2 in the intersecting width direction is the center area, and the edge area is positioned between the broken line d2 and the broken line d3.

An acoustic velocity in the center area of the electrode finger main body portion 13A is Va, and an acoustic velocity in the edge area of the electrode finger main body portion 13A is V'a. Further, an acoustic velocity in the center area of the narrow-pitch electrode finger portion 13*a* is Vb, and an acoustic velocity in the edge area of the narrow-pitch electrode finger portion 13*a* is V'b. Since the pitch A is larger than the pitch B, Va>Vb and V'a>V'b are satisfied.

A dimension of the edge area in the intersecting width direction of the electrode finger main body portion 13A is a width Ea of the edge area. A dimension of the edge area in the intersecting width direction of the narrow-pitch electrode finger portion, or a width of the edge area in the intersecting width direction of the narrow-pitch electrode finger portion is Eb. Then, Ea>Eb is satisfied. Accordingly, when Ea/V'a is equal or substantially equal to Eb/V'b, high-order transverse modes are significantly reduced or prevented.

Since V'a>V'b is satisfied, a minimal or a significantly reduced portion of the fundamental transverse mode phase rotation amount is set to be present in the center area by adjusting the magnitude of the widths Ea and Eb of the edge areas to satisfy the relationship described above. Moreover, a portion where the fundamental transverse mode phase rotation amount is 0 or nearly 0 is preferably present in the center area, for example. Accordingly, high-order transverse modes are significantly reduced or prevented and only a piston mode is excited in the first and second sections.

With reference to FIG. 2, description is provided above with respect to the first, second, and third IDTs 13, 14, and 15 including the narrow-pitch electrode finger portions 13*a*, 14*a*, 14*b*, and 15*a* as examples. In the above explanation, the electrode finger pitches of the electrode finger main body portions 13A, 14A, and 15A are considered to be constant. However, in reality, in a longitudinally coupled resonator-type elastic wave filter, such as the first preferred embodiment, the electrode finger pitch of the second IDT 4 positioned at the center and the electrode finger pitches of the first and third IDTs 3 and 5 positioned on both the sides generally differ from each other. Accordingly, because there are segments of different electrode finger pitches on the elastic wave propagation path even in a longitudinally coupled resonator-type elastic wave filter without including a narrow-pitch electrode finger portion, it is sufficient to adjust widths of the edge areas to satisfy the relationship described above.

In addition, if the narrow-pitch electrode finger portions as shown in FIG. 2 are included in the first, second, and third IDTs 3, 4, and 5 of the first preferred embodiment, it is sufficient to adjust the widths of the edge areas in consideration of the portions as well where the narrow-pitch electrode finger portions are provided. That is, a preferred embodiment of the present invention may be modified to include portion overlapping with three or more electrode finger pitches.

For example, if first, second, and third sections including different electrode finger pitches are included in the elastic wave propagation direction, acoustic velocities V1, V2, and V3 in the first, second, and third sections have a relationship of V1>V2>V3. In this case, it is also considered that acoustic velocities in the edge areas of the first, second, and third sections have a relationship of $V'1>V'2>V'3$. Widths of the edge areas in the first, second, and third sections correspond to E1, E2, and E3, respectively. Accordingly, it is sufficient to adjust the widths E1, E2, and E3 of the edge areas so that E1/V'1, E2/W2, and E3/W3 are equal or substantially equal to one another.

Comparative Example and Working Example

Next, a specific experimental example is described below.

Figure 3:
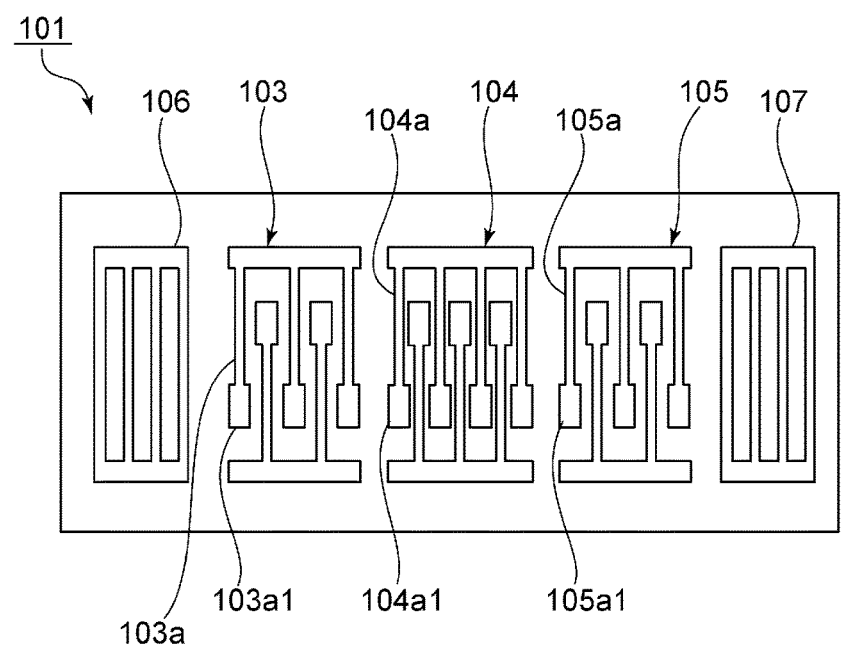
FIG. 3 is a schematic plan view illustrating the electrode structure of an elastic wave device according to a comparative example.

An elastic wave device 101 of a comparative example was prepared, as shown in FIG. 3. In the elastic wave device 101, first, second, and third IDTs 103, 104, and 105 are arranged in the elastic wave propagation direction. Reflectors 106 and 107 are provided on both sides of the first through third IDTs 103 through 105. Dimensions of wide width portions of the first, second, and third IDTs 103, 104, and 105 are all set to be equal to one another in the intersecting width direction. For example, a wide width portion 103a1 of an electrode finger 103a and a wide width portion 104a1 of an electrode finger 104a are equal to each other in dimension in the intersecting width direction. Accordingly, widths of the edge areas are set to be constant in the elastic wave propagation direction. Further, the first, second, and third IDTs 103, 104, and 105 do not include a narrow-pitch electrode finger portion. Thus, elastic wave propagation velocities in all the edge areas of the elastic wave device 101 in the comparative example are equal to one another. Other elements of the elastic wave device 101 are similar to those of the elastic wave device 1.

$LiNbO_3$ is included as a piezoelectric substrate in the elastic wave device 101, and dimensions of electrode finger pitches as well as intersecting areas in the intersecting width direction and widths of the edge areas in the first, second, and third IDTs 103, 104, and 105 were defined as follows.

For the first and third IDTs 103, 105 of the elastic wave device 101, the number of pairs of electrode fingers is 7.5 pairs; the electrode finger pitch is 3.81 µm; the dimension of center area in the intersecting width direction is 74.78 µm; and the edge area width is 1.25 µm. One pair of electrode fingers includes two electrode fingers with different polarities from each other that are interleaved with each other. Further, 1.5 pairs of electrode fingers include a total of three electrode fingers in which combined are two electrode fingers including one polarity and a single electrode finger including a different polarity from the one polarity and being interleaved with the two electrodes.

For the second IDT 104 of the elastic wave device 101, the number of pairs of electrode fingers is 25 pairs; the electrode finger pitch is 3.84 µm; the dimension of center area in the intersecting width direction is 74.78 µm; and the edge area width is 1.27 µm.

For the reflectors 106, 107 of the elastic wave device 101, the number of electrode fingers is 40 and the electrode finger pitch is 3.88 µm.

Figure 4:
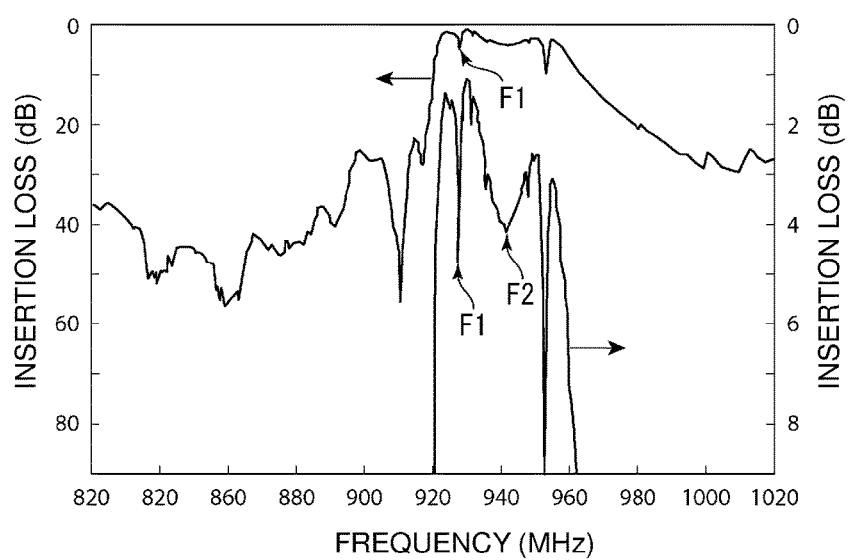
FIG. 4 is a diagram illustrating attenuation frequency characteristics of the elastic wave device of the comparative example shown in FIG. 3.

Attenuation frequency characteristics of the elastic wave device 101 of the comparative example prepared as described above are shown in FIG. 4. As is clear from FIG. 4, ripples due to transverse modes appear in the portions indicated by arrows F1 and F2, respectively, in other words, in the portions at a frequency of about 931.24 MHz and a frequency of about 948.09 MHz. These are the ripples due to high-order transverse modes. If a high-order transverse mode ripple is large like this, insertion loss is worsened in the pass band.

Figure 5:
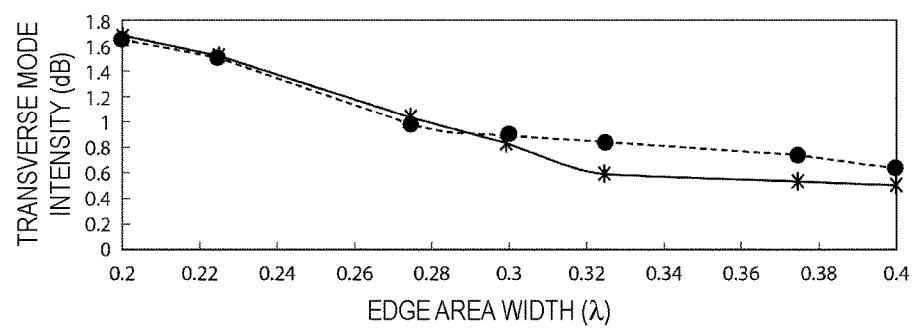
FIG. 5 is a diagram illustrating a relationship between an edge area width and a transverse mode intensity in an elastic wave device of a comparative example and an elastic wave device of a working example.

In order to significantly reduce or prevent the high-order transverse mode ripples, the inventors of preferred embodiments of the present invention varied the edge area width of the second IDT 4 positioned at the center within a range from about $0.2\lambda$ to about $0.4\lambda$. The widths of the edge areas of the first and third IDTs 3 and 5 positioned on both sides were maintained at about 18.23 µm. The total of the transverse mode ripple at the frequency of about 931.24 MHz and the transverse mode ripple at the frequency of about 948.09 MHz was represented as a transverse mode intensity (dB). FIG. 5 illustrates a relationship between the edge area width and the transverse mode intensity.

For comparison, also in the comparative example described above, the edge area width was varied from $0.2\lambda$ to $0.4\lambda$. In order to equalize all the widths of the edge areas of the first, second, and third IDTs 103, 104, and 105 in the comparative example, the widths of the edge areas of the first and third IDTs 103 and 105 were also varied similar to the width of the edge area of the second IDT 104.

In FIG. 5, a solid line indicates the result of the working example prepared according to a preferred embodiment of the present invention, and a broken line indicates the result of the comparative example shown in FIG. 3.

As is clear from FIG. 5, according to a preferred embodiment of the present invention, the high-order transverse mode intensity is reduced, in comparison with the comparative example, by adjusting the edge area width. In other words, if the edge area width Eb of the second IDT 4 positioned at the center is set to be no less than about $0.29\lambda$, the high-order transverse mode intensity is significantly reduced or prevented, in comparison with the comparative example. In the comparative example, the transverse mode intensity is too large to excite a piston mode. As opposed to this, according to the preferred embodiment described above, the high-order transverse mode intensity is significantly reduced or prevented and the piston mode is excited with certainty.

In the preferred embodiment described above, based on Ea/V'a being equal or substantially equal to Eb/V'b, the width Eb of the edge area of the second IDT 2 and the width Ea of the edge areas of the first and third IDTs 3 and 5 were adjusted. If segments of different electrode finger pitches are located on the elastic wave propagation path, high-order transverse modes are significantly reduced or prevented, as in the preferred embodiment described above, by adjusting the widths of the edge areas and/or the acoustic velocities in the edge areas in accordance with conditions of differences in the electrode finger pitches, in other words, conditions of differences in the acoustic velocities. Accordingly, an ideal or a substantially ideal piston mode is excited. Thus, the widths of the edge areas and the metallization ratios in the edge areas may both be adjusted in accordance with the variations of the electrode finger pitches.

Figure 6:
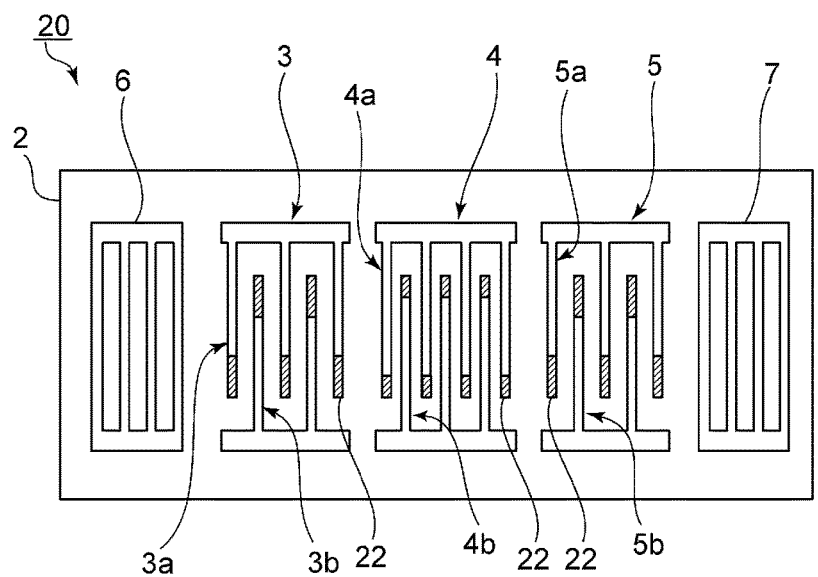
FIG. 6 is a schematic plan view of an elastic wave device according to a variation of a preferred embodiment of the present invention.

Further, according to a variation of a preferred embodiment of the present invention, as illustrated in a schematic plan view in FIG. 6, a piston mode is able to be excited by attaching mass addition films 22, for example, dielectric films, to respective leading end portions of the first and second electrode fingers 3a, 3b, 4a, 4b, 5a, and 5b. In the elastic wave device 20 shown in FIG. 6, film thicknesses, materials, or the like of the mass addition films 22 may differ from one another. In other words, the film thicknesses, materials, or the like of the mass addition films 22 of the second IDT 4 whose electrode finger pitch is smaller may differ from the film thicknesses, materials, or the like of the mass addition films 22 of the first and third IDTs 3 and 5 whose electrode finger pitches are larger.

That is, it is sufficient to adjust various conditions, under which the piston mode is excited, such as thicknesses and materials of the mass addition films in the edge areas, metallization ratios in the edge areas, and so on, in addition to the edge area widths described above, in accordance with differences in the electrode finger pitches.

Figure 7:
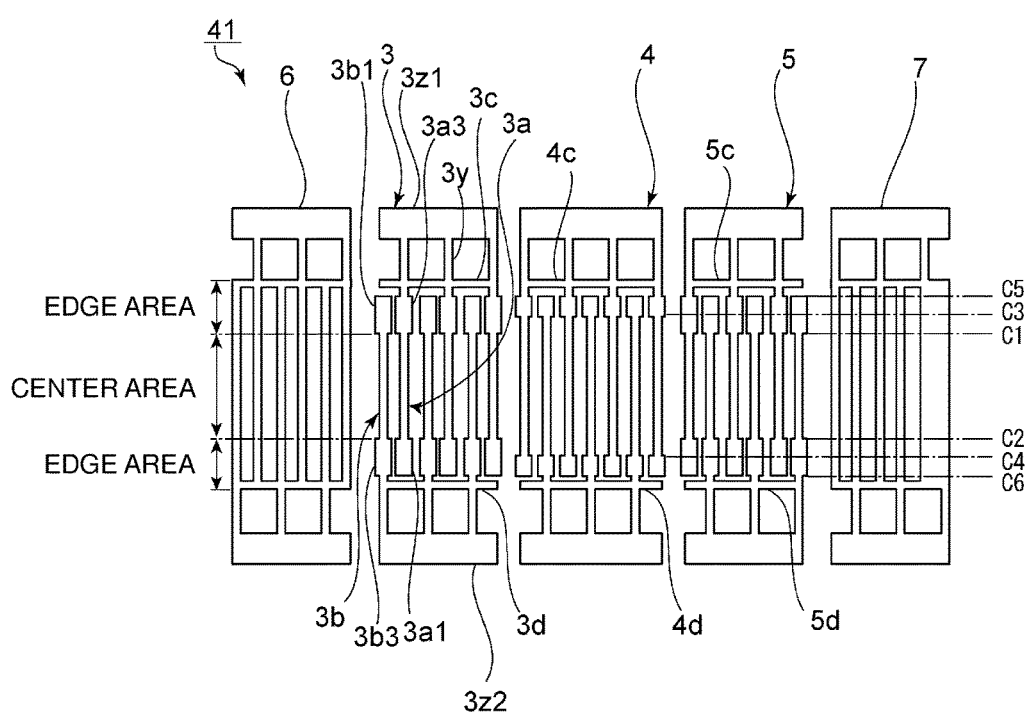
FIG. 7 is a schematic plan view of an elastic wave device according to a variation on the first preferred embodiment of the present invention shown in FIG. 1.

FIG. 7 is a schematic plan view illustrating the electrode structure of an elastic wave device according to a variation of the first preferred embodiment. In an elastic wave device 41 according to the present variation of the first preferred embodiment, busbars 3c, 3d, 4c, 4d, 5c, and 5d of the first, second, and third IDTs 3, 4, and 5 are narrower in width than the corresponding busbars in the first preferred embodiment. Further, wide width portions of the electrode fingers are provided not only at the leading end side but also at an electrode finger base end side in the first, second, and third IDTs 3, 4, and 5.

Referring to the first IDT 3 as an example, in addition to the wide width portions 3a1 and 3b1 respectively provided at the leading ends of the first electrode finger 3a and the second electrode finger 3b, second wide width portions 3a3 and 3b3 are provided on the base end side. The second wide width portion 3a3 is provided at a position overlapping with the wide width portion 3b1 provided on the second electrode finger 3b in the elastic wave propagation direction. The second wide width portion 3b3 is also provided at a position overlapping with the wide width portion 3a1 in the elastic wave propagation direction. In the second and third IDTs 4 and 5, second wide portions are further provided on the base end side of the respective electrode fingers as described above. Furthermore, a width as a dimension along the elastic wave propagation direction of the second wide width portions 3a3 and 3b3 each provided on the base end side and a length as a dimension along the electrode finger direction of the second wide width portions 3a3 and 3b3, are preferably equal or substantially equal to the width and length of the wide width portions 3a1 and 3b1 each provided on the leading end side.

Referring to the first IDT 3 as an example, a width of each of the small-width busbars 3c and 3d, or a dimension in a direction orthogonal or substantially orthogonal to the elastic wave propagation direction is about 0.75 μm, for example. A width of each of busbars 3z1 and 3z2 positioned on the outer side is about 10.00 μm, for example. The busbars 3c and 3z1 and the busbars 3d and 3z2 are respectively connected by busbar connecting portions 3y extending in the electrode finger intersecting width direction. A length of the busbar connecting portion 3y, or a dimension of the busbar connecting portion 3y in the electrode finger intersecting width direction is about 7.48 μm, for example.

In the present variation of the first preferred embodiment, because the second wide width portions are provided on the base end sides of the first and second electrode fingers, edge areas include the wide width portions on both sides of the center area at a portion where the first and second electrode fingers are positioned. Therefore, the piston mode is more likely to be excited.

The small-width busbars 3c, 3d, 4c, 4d, 5c, and 5d are able included in the first preferred embodiment.

Figure 8:
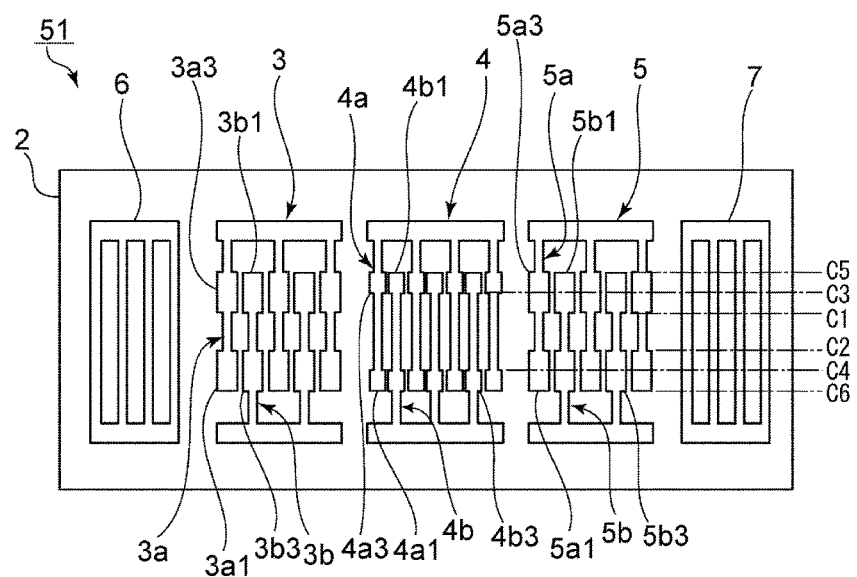
FIG. 8 is a schematic plan view of an elastic wave device according to a variation on the first preferred embodiment of the present invention.

FIG. 8 is a schematic plan view illustrating another variation on the elastic wave device according to the first preferred embodiment of the present invention. An elastic wave device 51 shown in FIG. 8 corresponds to the another variation of the first preferred embodiment. Also in the elastic wave device 51 of the present variation of the first preferred embodiment, similar to the elastic wave device 41 shown in FIG. 7, the second wide width portions 3a3, 3b3, 4a3, 4b3, 5a3, and 5b3 are provided on each base end side of the first and second electrode fingers 3a, 3b, 4a, 4b, 5a, and 5b. Other elements are the same as or similar to those of the preferred embodiment shown in FIG. 1.

According to a preferred embodiment of the present invention, an elastic wave propagation path includes a portion where electrode finger pitches are changed. Further, if the elastic wave propagation path includes a portion where metallization ratios are changed, edge widths of the edge areas, film thicknesses, materials, or the like of mass addition films in the edge areas, or the metallization ratios in the edge areas may differ from each other in accordance with difference in the metallization ratios. Because these ratios differ as described above, acoustic velocities in the edge areas are able to be adjusted.

Furthermore, in a structure in which the piston mode is excited by providing the aforementioned mass addition films, if thicknesses, materials, or the like of the mass addition films differ from each other on a portion of the elastic wave propagation path, edge area widths, edge area metallization ratios, and the like, which are conditions under which the piston mode is excited, may be changed in accordance with the differences in the factors described above. Accordingly, the acoustic velocities in the edge areas are able to be adjusted.

Third Preferred Embodiment

Figure 9:
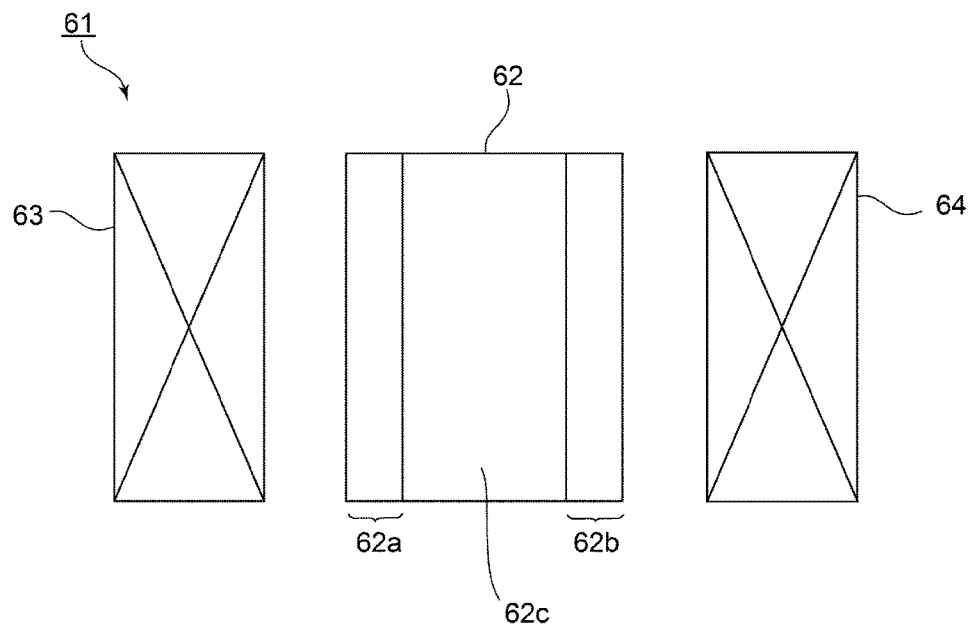
FIG. 9 is a schematic plan view illustrating a one-port type elastic wave resonator according to a third preferred embodiment of the present invention.

Although in the above-described preferred embodiments of the present invention, longitudinally coupled resonator-type elastic wave filters including a plurality of IDTs are described above, a preferred embodiment of the present invention may be applied to an elastic wave device including only one IDT. For example, a third preferred embodiment of the present invention as shown in FIG. 9 is be applied to a one-port type elastic wave resonator. In a one-port type elastic wave resonator 61, reflectors 63 and 64 are respectively disposed on both sides of an IDT 62. The IDT 62 includes narrow-pitch electrode finger portions 62a and 62b. Accordingly, an electrode finger main body portion 62c sandwiched between the narrow-pitch electrode finger portions 62a and 62b provide a first section, and the narrow-pitch electrode finger portions 62a and 62b provide a second section.

Moreover, the present invention is able to be applied to not only surface acoustic wave devices but also boundary acoustic wave devices that propagate boundary acoustic waves.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An elastic wave device comprising:
a piezoelectric substrate; and
at least one interdigital transducer (IDT) located on the piezoelectric substrate; wherein
the least one IDT includes a plurality of first electrode fingers and a plurality of second electrode fingers interleaved with the plurality of first electrode fingers;
in a portion of the least one IDT where the plurality of first electrode fingers and the plurality of second electrode fingers intersect with each other in an elastic wave propagation direction, edge areas are provided on both sides of a center area in an intersecting width direction in which the first and second electrode fingers extend;

in the edge areas, an elastic wave propagation velocity is slower than an elastic wave propagation velocity in the center area;

the elastic wave device further includes a first section where the propagation velocity in the center area is relatively fast and a second section where the propagation velocity in the center area is relatively slow in the elastic wave propagation direction; and the elastic wave propagation velocity in the center area of the first section and the elastic wave propagation velocity in the center area of the second section, the elastic wave propagation velocity, a width as a dimension along the intersecting width direction in the edge area of the first section, the elastic wave propagation velocity, and a width as a dimension along the intersecting width direction in the edge area of the second section excite a piston mode in each of the first section and the second section.

2. The elastic wave device according to claim 1, wherein the piston mode is excited to provide a minimal or a significantly reduced portion of a fundamental transverse mode phase rotation amount included in each center of the first section and the second section in the intersecting width direction.

3. The elastic wave device according to claim 2, wherein a portion in which the fundamental transverse mode phase rotation amount is approximately 0 is included in the center of the elastic wave device in the intersecting width direction.

4. The elastic wave device according to claim 1, wherein the elastic wave propagation velocity and the width as a dimension along the intersecting width direction in the edge area of the first section and the elastic wave propagation velocity and the width as a dimension along the intersecting width direction in the edge area of the second section, respectively correspond to the width as a dimension of the edge area of the first section along the intersecting width direction and the width as a dimension of the edge area of the second section along the intersecting width direction.

5. The elastic wave device according to claim 4, wherein the width as a dimension of the edge area of the first section in the intersecting width direction is larger than the width as a dimension of the edge area of the second section in the intersecting width direction.

6. The elastic wave device according to claim 5, wherein a dimension of the center area of the first section in the intersecting width direction differs from a dimension of the center area of the second section in the intersecting width direction.

7. The elastic wave device according to claim 1, wherein an electrode finger pitch in the first section is larger than an electrode finger pitch in the second section.

8. The elastic wave device according to claim 1, wherein a metallization ratio of the first section is larger than a metallization ratio of the second section.

9. The elastic wave device according to claim 1, wherein mass addition films are provided on the first and second electrode fingers in the edge areas, and a thickness of the mass addition film in the first section is thinner than a thickness of the mass addition film in the second section.

10. The elastic wave device according to claim 1, wherein, in the edge areas, a propagation velocity in the first section is $V'a$, an elastic wave propagation velocity in the second section is $V'b$, a width as a length of one edge area in a direction in which the electrode finger extends in the first section is $Ea$, a width of the edge area in the second section is $Eb$, and $Ea/V'a$ is equal or substantially equal to $Eb/V'b$.

11. The elastic wave device according to claim 10, wherein the widths of the edge areas in the first section and the second section are selected so that $Ea/V'a$ is equal or substantially equal to $Eb/V'b$.

12. The elastic wave device according to claim 10, wherein the metallization ratios of the edge areas in the first section and the second section are selected so that $Ea/V'a$ is equal or substantially equal to $Eb/V'b$.

13. The elastic wave device according to claim 10, wherein mass addition films are provided on the first and second electrode fingers in the edge areas and laminated to cover the edge areas in the first section and the second section, and the film thicknesses of the respective mass addition films positioned in the first section and the second section are selected so that $Ea/V'a$ is equal or substantially equal to $Eb/V'b$.

14. The elastic wave device according to claim 10, wherein mass addition films are provided on the first and second electrode fingers in the edge areas and laminated to cover the edge areas in the first section and the second section, and at least one type is selected among the widths of the edge areas positioned in the first section and the second section, the metallization ratios of the edge areas, and the film thicknesses of the mass addition films laminated on the edge areas so that $Ea/V'a$ is equal or substantially equal to $Eb/V'b$.

15. The elastic wave device according to claim 1, wherein:
wide width portions are provided at respective leading end sides of the first electrode fingers and the second electrode fingers;
each width of the wide width portions, as a dimension along the elastic wave propagation direction, is wider than a width of the first and second electrode fingers in the center area; and
the edge areas include the wide width portions.

16. The elastic wave device according to claim 15, wherein a second wide width portion is provided on the first electrode finger at a position overlapping with the wide width portion provided on the second electrode finger in the elastic wave propagation direction, and another second wide width portion is provided on the second electrode finger at a position overlapping with the wide width portion provided on the first electrode finger in the elastic wave propagation direction.

17. The elastic wave device according to claim 1, wherein the at least one IDT includes a plurality of IDTs that are arranged along the elastic wave propagation direction, and at least one of the plurality of IDTs corresponds to the first section while at least one of the remaining IDTs corresponds to the second section.

18. The elastic wave device according to claim 1, wherein the elastic wave device is a longitudinally coupled resonator-type elastic wave filter.

19. The elastic wave device according to claim 1, wherein:
the least one IDT includes an electrode finger main body portion and a narrow-pitch electrode finger portion including a narrower electrode finger pitch than the electrode finger main body portion and being provided at an end portion of the least one IDT in the elastic wave propagation direction; and the electrode finger main body portion corresponds to the first section and the narrow-pitch electrode finger portion corresponds to the second section.

20. The elastic wave device according to claim 1, wherein the at least one IDT includes only one IDT, and reflectors are disposed on both sides of the one IDT in the elastic wave propagation direction to provide a one-port type elastic wave resonator.

\* \* \* \* \*